(12) United States Patent
Kim (10) Patent No.: US 6,380,629 B1
(45) Date of Patent: Apr. 30, 2002

(54) WAFER LEVEL STACK PACKAGE AND METHOD OF FABRICATING THE SAME

(75) Inventor: Jae Myun Kim, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/595,113

(22) Filed: Jun. 16, 2000

(30) Foreign Application Priority Data

Jun. 29, 1999 (KR) .............................................. 99-25215

(51) Int. Cl.[7] .......................... H01L 23/48; H01L 23/52; H01L 29/40
(52) U.S. Cl. ....................... 257/777; 257/723; 257/773; 257/774; 257/786; 361/760; 438/108; 438/109
(58) Field of Search .................... 257/723, 731–733, 257/735, 773–781, 784, 786; 361/760; 438/108, 109

(56) References Cited

U.S. PATENT DOCUMENTS

| | | | |
|---|---|---|---|
| 4,996,583 A | 2/1991 | Hatada | ........................ 257/724 |
| 5,526,230 A | 6/1996 | Val | .............................. 361/704 |
| 5,571,754 A | * 11/1996 | Bertin et al. | ................. 438/109 |
| 5,870,289 A | * 2/1999 | Tokuda et al. | ............... 361/779 |
| 5,898,223 A | * 4/1999 | Frye et al. | .................... 257/777 |
| 5,973,391 A | * 10/1999 | Bischoff et al. | ............. 257/678 |

FOREIGN PATENT DOCUMENTS

| | | | |
|---|---|---|---|
| JP | 63107127 A | * | 5/1988 |
| JP | 08236694 | | 9/1996 |

* cited by examiner

*Primary Examiner*—Eddie Lee
*Assistant Examiner*—Chris C. Chu
(74) *Attorney, Agent, or Firm*—Pillsbury Winthrop LLP

(57) ABSTRACT

A wafer level stack package according to the present invention has upper and lower semiconductor chips stacked together in a wafer level. Each chip has a first face where bond pads are formed and an opposite second face. The first faces confront each other in a stack. In each chip, metal patterns are connected to the bond pads and intervene between insulating layers. Through holes are formed at both sides of the upper chip, and a pattern film is adhered to the second face of the upper chip. The metal patterns are exposed in the through holes and electrically connected to solder balls on the pattern film. A related method is also provided.

9 Claims, 8 Drawing Sheets

WAFER LEVEL STACK PACKAGE AND METHOD OF FABRICATING THE SAME

BACKGROUND OF THE INVENTION

1. Field of the Invention

This invention relates to a stack package and a method of fabricating the same, more particularly to a stack package consisting of at least two stacked semiconductor chips and a method of fabricating the same.

2. Description of the Related Art

Rapid progress in the memory chip has been presented to increase memory capacity. Currently, 128 M DRAM is mass-produced, and also the mass-production of 256 M DRAM will be available sooner or later.

To increase memory chip capacity, i.e. the high integration, a technology for inserting cells as many as possible into a given area of semiconductor device, is widely known. However, this method requires high technology such as a precise line width and a considerable amount of time for development. Accordingly, a relatively simpler stacking technology to optimize integrity of the semiconductor device has been developed most recently.

The term "stacking" used in semiconductor industry means a technique to double the memory capacity by heaping up at least two semiconductor chips in a vertical direction. According to the stacking technique, a 128 M DRAM device can be constituted by two 64 M DRAM devices for instance, also a 256 M DRAM device can be constituted by two 128 M DRAM devices.

Figure 1:
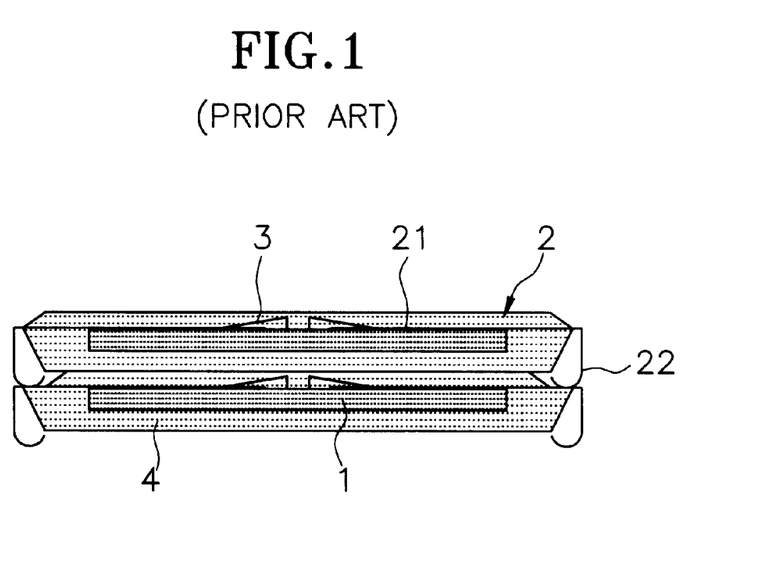
FIGS. 1 and 2 are cross-sectional views for conventional stack packages.
Figure 2:
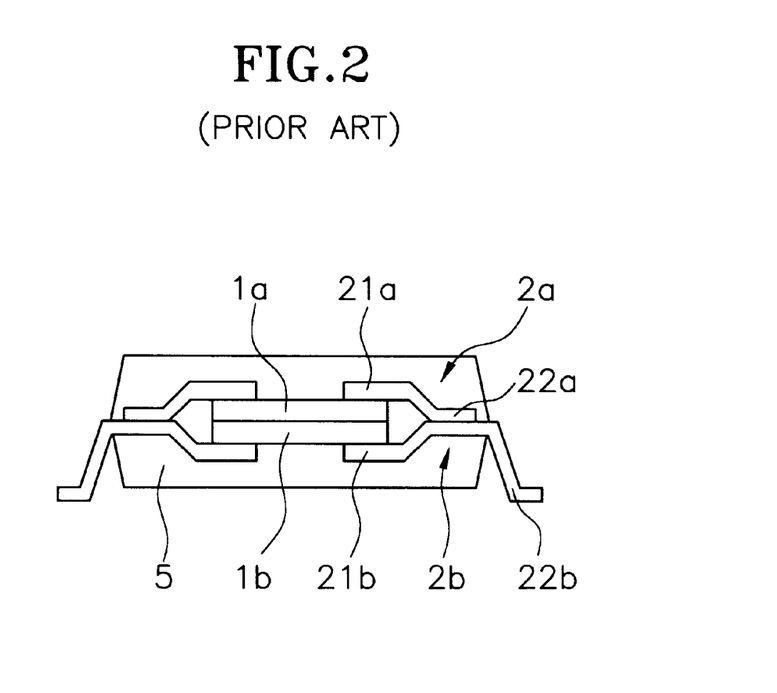

Merely an example of a package fabricated according to the typical stacking technique is illustrated in FIGS. 1 and 2.

As shown in FIG. 1, a lead frame 2 is attached by means of an adhesive to a semiconductor chip 1 in which a bond pad is disposed on an upper portion thereof. An inner lead 21 of the lead frame 2 is connected to the bondpad with a metal wire 3. The entire resultant is sealed with a molding compound 4 such that both ends of an outer lead 22 of the lead frame 2 are protruded therefrom.

On the package as constituted above, another package having the same constitution as above is stacked. That is to say, the outer lead 22 of the package in the upper position is in contact with a midway portion of the lead frame 2 in the lower position thereby electrically connecting each other.

However, there is a drawback in the general stack package that the whole thickness of the package is too thick. Furthermore, since an electrical signal should pass the lead frame of the lower package through the outer lead of the upper package, there is another drawback that the electrical signal path is too long. Especially, bad connections are frequently occurred due to bad soldering since leads of both upper and lower packages are joined with each other by soldering.

A conventional stack package to solve foregoing problems is illustrated in FIG. 2.

As shown in the drawing, upper and lower semiconductor chips 1a and 1b are attached each other. An inner lead 21a of an upper lead frame 2a is attached on the upper surface of the upper semiconductor chip 1a. The inner lead 21a of the upper semiconductor chip 1a is electrically connected to a bonding pad of the upper semiconductor chip 1a with a metal wire (not shown). Further, an inner lead 21b of a lower lead frame 2b is attached on the bottom surface of the lower semiconductor chip 1b. The inner lead 21b of the lower lead frame 2b is electrically connected to a bonding pad of the lower semiconductor chip 1b with a metal wire(not shown).

An outer lead 22a of the upper lead frame 1a is electrically bonded at a midway portion of the lower lead frame by the laser and an outer lead 22b of the lower lead frame 2b is protruded from a molding compound 5.

However, it is impossible to manufacture the wafer level stack package since stacking and packaging steps for each semiconductor chip should be performed in the foregoing conventional stack package.

Furthermore, the lead frame electrically connecting each semiconductor chip and transmitting electrical signals outside is too long to conduct. Although a pattern tape instead the lead frame is used, the results will be the same.

SUMMARY OF THE INVENTION

Accordingly, the present invention is provided to solve the foregoing problems of the conventional devices and it is one object to provide a wafer level stack package constituted by stacking at least two semiconductor chips in the wafer level and a method of fabricating the same.

Another object of the present invention is to improve electrical conductivity performance by shortening the electrical signal transmission path.

To accomplish the above objects, the wafer level stack package according to the present invention consists as follows.

Bond pads are formed on each first face of upper and lower semiconductor chips, and the upper and the lower semiconductor chips are arranged such that their first faces are opposed to each other with a selected distance. First insulating layers is coated on the respective first faces of the semiconductor chips so that their bond pads are exposed the first insulating layer. Upper and lower metal patterns whose one ends are connected to the respective bond pads and the other ends are extended toward the contours of the respective semiconductor chips. Meanwhile, on the upper semiconductor chip, a through hole exposing the respective other ends of the upper and the lower metal patterns is formed along the contour of the semiconductor chip. Second insulating layers are coated on the respective first insulating layers of the semiconductor chips and the second insulating layers are adhered to each other thereby forming one body of the upper and the lower semiconductor chips as a stack structure. There is deposited a medium pattern for electrically connecting the respective other ends of the upper and the lower metal patterns at an inside wall of the through hole.

A pattern film is adhered on a second face of the upper semiconductor chip opposite to the first face of the upper semiconductor chip. The pattern film comprises an insulating film and a metal line arranged inside the insulating film. One end of the metal line is exposed from the insulating film thereby forming a ball land. And, the other end of the metal line is exposed through both sides of the insulating film. A metal wire is extended from the other end of the metal line through the through hole, and the metal wire is bonded on the medium pattern. The through hole is filled with a molding compound whose top surface is in the same plane as that of the pattern film. Solder balls are mounted at the ball land of the pattern film.

A method of fabricating the wafer level stack package as constructed above is as follows.

First insulating layers are coated on each first face of two wafers constituted a plurality of semiconductor chips therein, and then the first insulating layers are etched thereby exposing bond pads of the respective semiconductor chips. A metal layer is deposited on the first insulating layers respectively, then patterned thereby forming a metal pattern whose one end is connected to the bond pads and the other end is extended toward the contours of the respective semiconductor chips. Second insulating layers are coated on the respective first insulating layers and then the second insulating layer of a selected wafer is etched thereby exposing the other end of the metal pattern in the selected wafer.

Afterward, the second insulating layers are confronted and adhered to each other so that two wafers are overlapped. At this time, the wafer whose the other end of the metal pattern is exposed from the second insulating layer is disposed at a lower portion. Since a through hole is formed by partially removing the contours of the semiconductor chips formed on the upper wafer, the respective other ends of the upper and the lower metal patterns are exposed via the through holes. A medium pattern is deposited on an inside wall of the through holes, thereby electrically connecting the other ends of an upper metal pattern of the upper wafer and a lower metal pattern of the lower wafer.

Meanwhile, a pattern film having an arrangement of metal lines in the insulating film is provided. One end of the metal line is exposed through the insulating film thereby forming a ball land, and the other end of the metal line is exposed through both sides of the insulating film. Further, slots at a corresponding position to the through holes of the upper semiconductor chip are formed on the insulating film, and a metal wire for electrically connecting the respective other ends of the metal lines is extended via the slots.

The pattern film having the foregoing structure is attached to a second face of the upper wafer that is opposite to the first face of that, thereby fitting the slots and the through holes. After the metal wire is cut off, the cut metal portion is bonded to the medium pattern. Then, inside of the through holes is filled with a molding compound. Herein, a top surface of the molding compound is in the same plane with that of the pattern film. Solder balls are mounted at the ball land of the pattern film. With respect to an outer wall of the through holes, the wafer is cut off and separated into individual semiconductor chips.

According to the constitution of the present invention, stacking and packaging two semiconductor chips in the wafer level are implemented. Further, a pattern film is attached to a backside of a selected stacked semiconductor chip, and a solder ball is mounted at the pattern film thereby shortening the signal transmission path. As a result, the electrical conductivity performance is improved. Particularly, the width of package can be implemented within the width of the semiconductor chip.

DETAILED DESCRIPTION OF THE PREFERRED EMBODIMENTS

Figure 3:
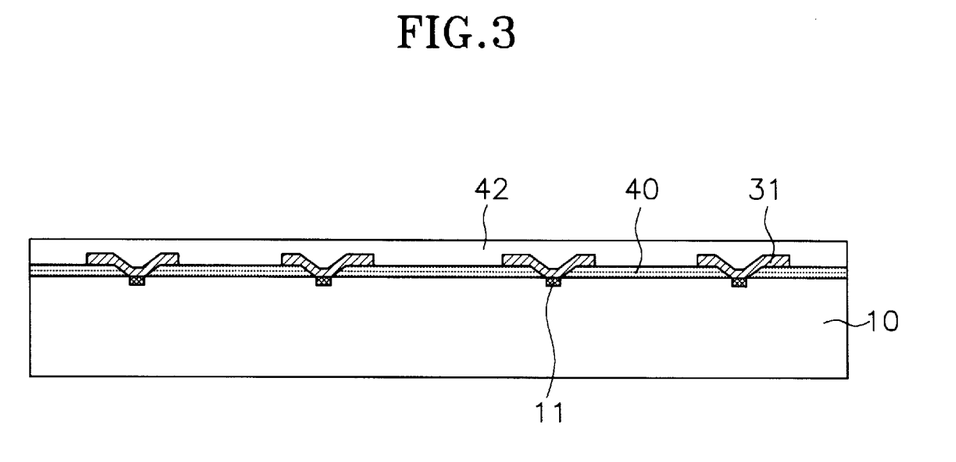
FIGS. 3 to 15 are views for illustrating a manufacturing procedure of a wafer level stack package according to the present invention.
Figure 4:
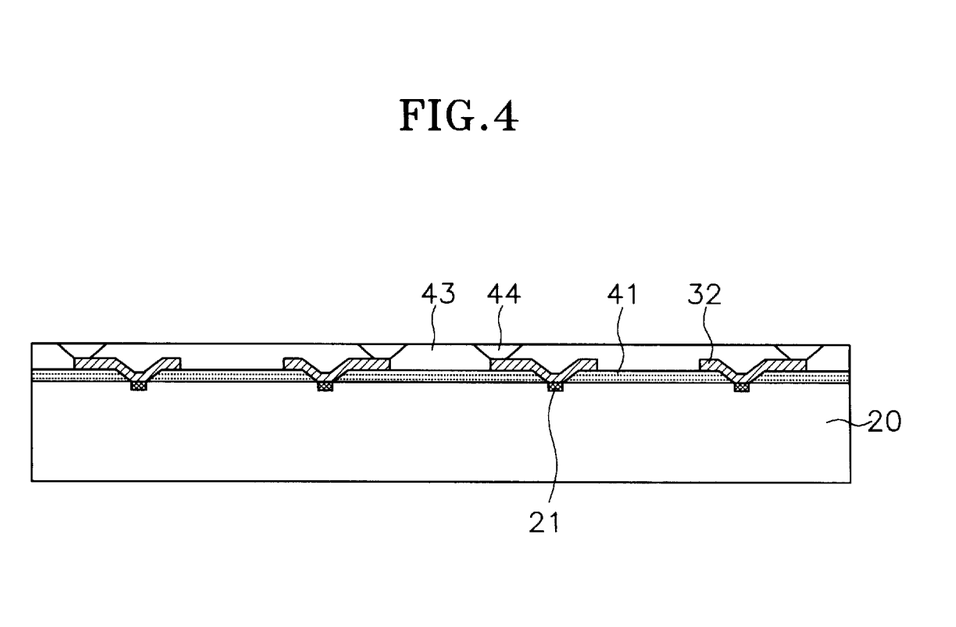

First, two wafers 10 and 20 as shown in FIGS. 3 and 4 are provided. The wafer 10 in FIG. 3 will be disposed at an upper position and the wafer 20 in FIG. 4 will be disposed at a lower position during stacking step hereinafter described. Accordingly, the wafer 10 in FIG. 3 is called hereinafter as to "upper wafer" and the wafer 20 in FIG. 4 is called as to "lower wafer".

Figure 5:
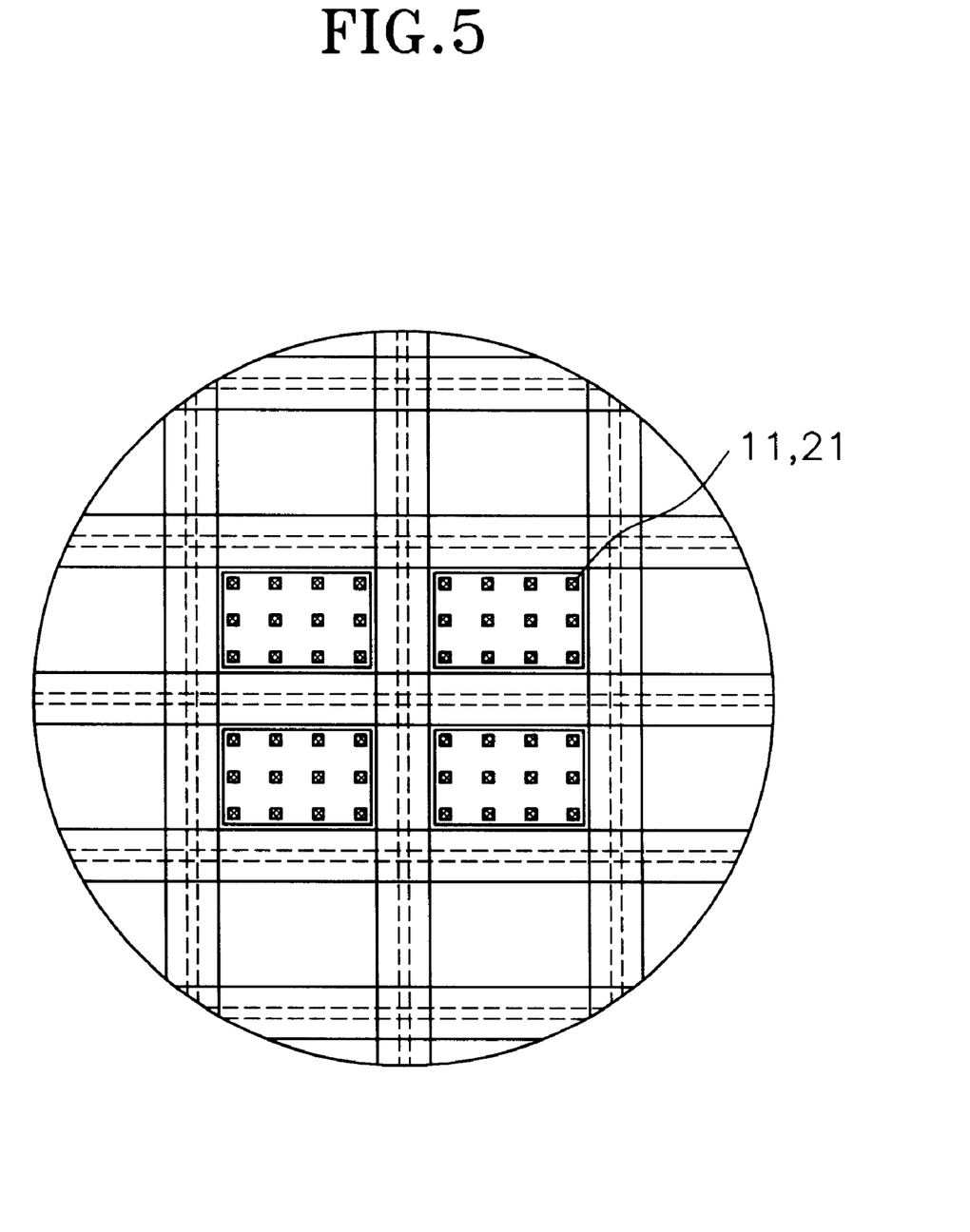

A plurality of semiconductor chips are formed in those upper and lower wafers 10 and 20, and bond pads 11, 21 are formed at first faces of the respective semiconductor chips. Particularly, bond pads 11 and 21 of this embodiment as shown in FIG. 5, are arranged along the edge of the semiconductor chips.

First insulating layers 40,41 are coated on the first faces of the upper and the lower wafers 10,20 with a selected thickness. Then, the first insulating layers 40,41 are etched thereby exposing the respective bond pads 11,21.

Continuously, metal layers are deposited on the first faces of the wafers 10, 20 and then patterned, thereby forming metal patterns 31, 32 whose one ends are connected to the bond pads 11, 21 and the other ends are extended toward the contours of the respective semiconductor chips. Herein, during a patterning step of the metal layers as illustrate to compare each other in FIGS. 3 and 4, the length of the lower metal pattern 32 is formed longer than that of the upper metal pattern 31. The reason will be described later. Next, second insulating layers 42, 43 are coated on the first faces of the wafers 10, 20 with a selected thickness. And then, only the second insulating layer 43 coated on the lower wafer 20 is etched to form a window 44. The other ends of the lower metal pattern 32 are therefore outwardly exposed through the window 44.

Figure 6:
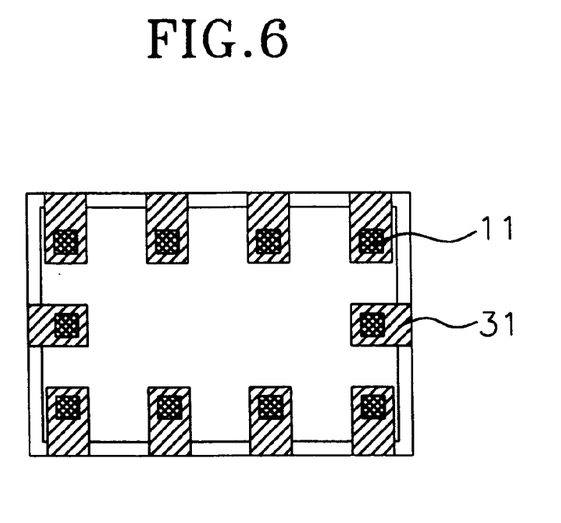
Figure 7:
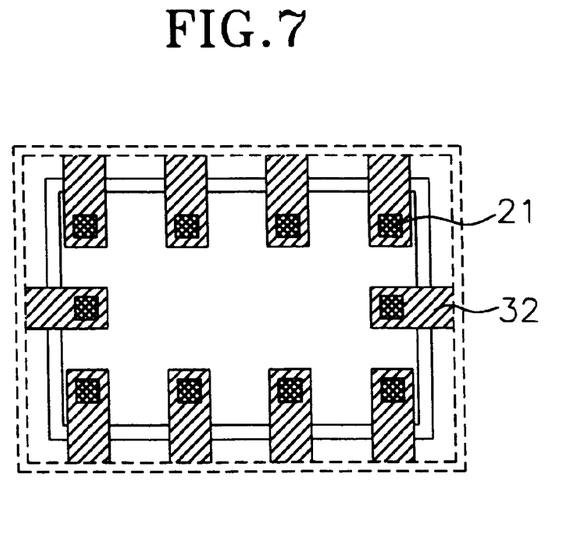

Illustrated are FIGS. 6 and 7 of plane views of individual semiconductor chips in the upper and the lower wafers 10, 20 as fabricated up to now. FIG. 6 shows a semiconductor chip constructed on the upper wafer 10, and as shown in the drawing, one end of the upper metal pattern 31 is connected to the bond pad 11 and the other end is extended toward the contour of the semiconductor chip. FIG. 7 shows a semiconductor chip constructed on the lower metal 20, and as shown in the drawing, one end of the lower metal pattern 32 is connected to the bond pad 21 and the other end is extended longer than that of the upper metal pattern 31 toward the contour of the semiconductor chip.

Figure 8:
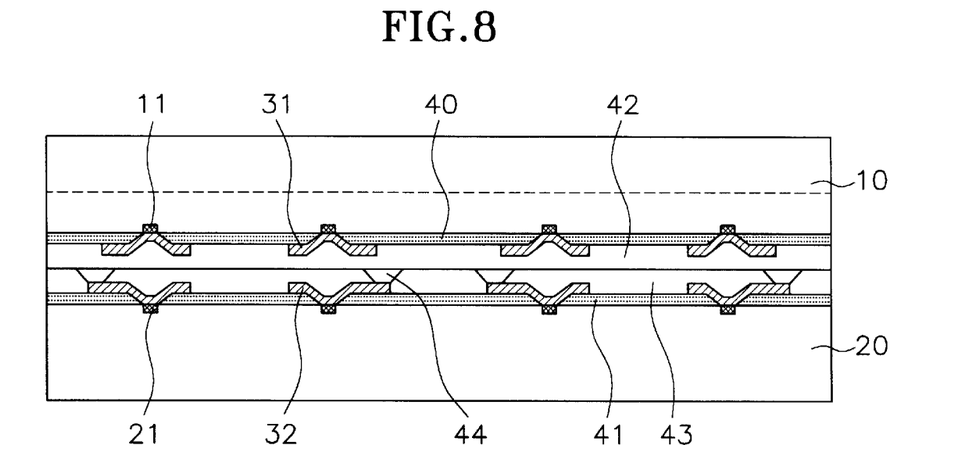

Continuously, as shown in FIG. 8, their first faces of two wafers 10,20 are confronted each other and thermal-compressed. Before said step, a curing step for the respective second insulating layers 42,43 is preceded. At this time, the respective second insulating layers 42,43 are cured not completely but partially. Therefore, when two wafers 10 and 20 are thermal-compressed, those wafers 10,20 can be easily attached to each other. Afterward, the backside of the upper wafer 10 is polished to the point of dotted line illustrated in FIG. 8, and removed. The reason for polishing and removing is to reduce the entire thickness of the stack package as well as the length of a metal wire during a subsequent wire bonding step.

Figure 9:
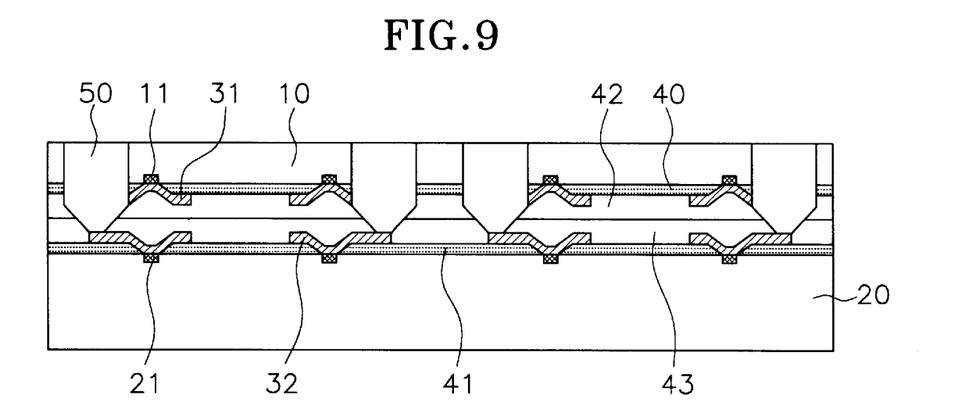

Afterward, as shown in FIG. 9, through holes 50 are formed in both side portions of the semiconductor chip of the upper wafer 10, which are shown as both sides in the drawing, however substantially corresponding to positions of the other ends of the respective metal patterns 31, 32 in FIGS. 6 and 7. The number of through holes 50 is accordingly equal to that of the bond pads 11,21. By forming the through holes 50, the other ends of the lower metal pattern 32 are exposed through a bottom center of the through hole 50, and the other ends of the upper metal pattern 31 are exposed through a side of the through hole 50.

Herein, since the lower metal pattern 32 is already exposed through the window (44 in FIG. 8) in the second insulating layer 43, accordingly the lower metal pattern 32 is exposed by merely removing the upper wafer 10. This step is required for the purpose of convenience in the manufacturing process. Without exposing the lower metal patterns 31,32 can be simultaneously exposed while the through hole 50 is formed at the moment. Further, in the present embodiment, the bottom of the through hole 50 is formed in shape of letter "V" so as to form the bottom of the through hole 50 in the same plane with an inclined etched face of second insulating layer 43 and as well as to expose the other end of the lower metal pattern 32 being disposed on the bottom center of the through hole 50. Accordingly, the shape of the bottom of the through hole 50 has not to be the V shape. Meanwhile, an outer wall of the through hole 50 becomes a cutting base line at a subsequent cutting step.

Figure 10:
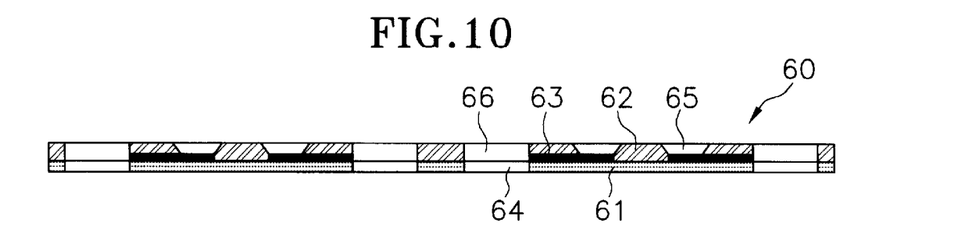
Figure 11:
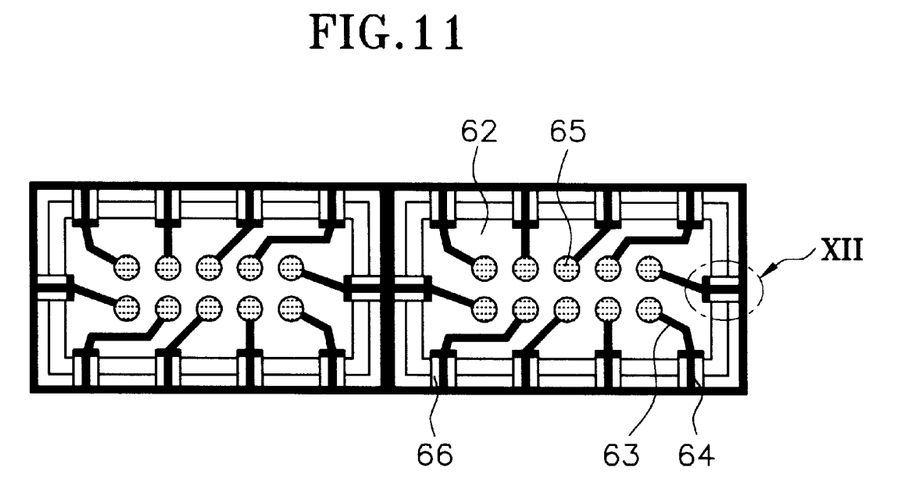
Figure 12:
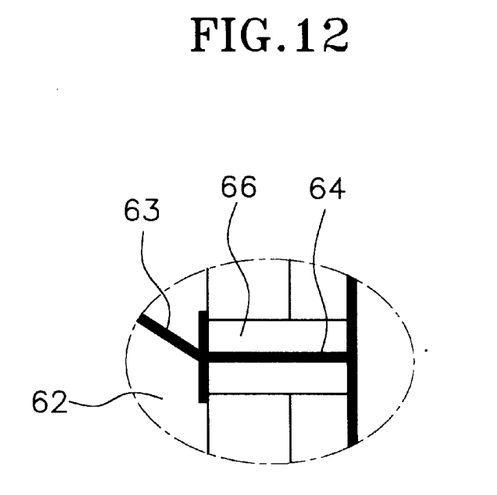

Next, a pattern film 60 as shown in FIG. 10 is provided. The pattern film 60 has a structure in which metal lines 63 are arranged between upper and lower insulating layers 62,61. More particularly, as shown in FIG. 11, the pattern film 60 has the size corresponding to that of the wafer and sectionalized according to the size of the lower semiconductor chip. FIG. 11 illustrates the pattern film 60 of the size only corresponding to two semiconductor chips. As illustrated, a metal line 63 is arranged on the lower insulating film 61 and the upper insulating film 62 is coated thereon. Particularly, one ends of the metal line 63 are exposed outwardly through an etching slot formed in the upper insulating film 62 thereby forming a ball land 65 and the other ends of that are exposed through both sides of the upper and the lower insulating film 62,61. Meanwhile, in the insulating layers 61,62, there are formed slots 66 at locations corresponding to the through holes 50. Therefore, the other ends of the metal line 63 are exposed through the slots 66 and connected to each other by metal wires 64 extended through the slots 66. This arrangement is illustrated in FIG. 12 showing in detail XII portion of FIG. 11.

Figure 13:
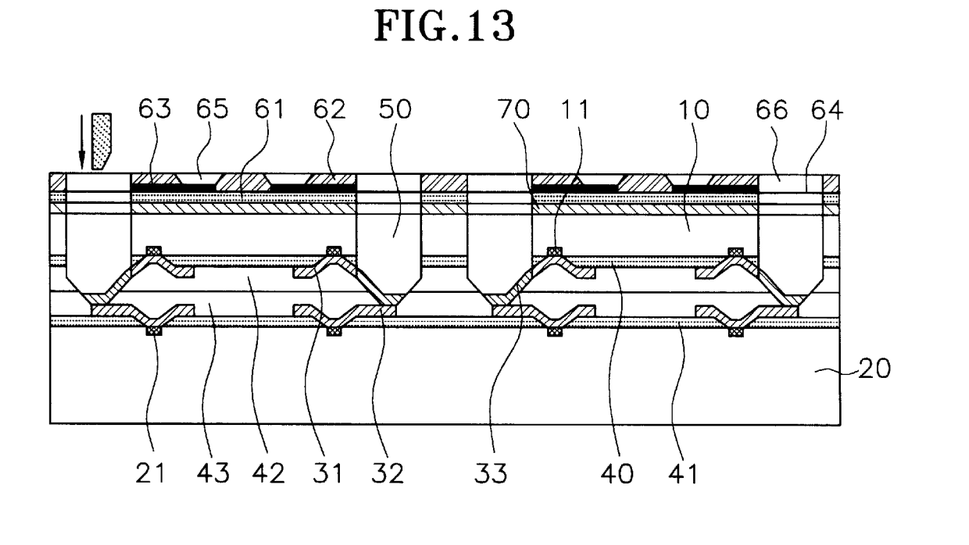

Continuously, as shown in FIG. 13, a medium pattern 33 is deposited at the inside wall of the through hole 50, thereby electrically connecting the respective other ends of the exposed upper and the lower metal patterns 31, 32. Next, the pattern film 60 having aforementioned structure is attached to a second face opposite to the first face of the upper wafer 10 by means of an adhesive 70. At this time, slots 66 and through holes 50 of the pattern film 60 are fitted with each other thereby exposing the medium pattern 33 upwardly. Next, the metal wire 64 is cut off and a portion of the cut metal wire 64 is bonded to the medium pattern 33 thereby electrically connecting the pattern film 60 and the stacked semiconductor chips.

Figure 14:
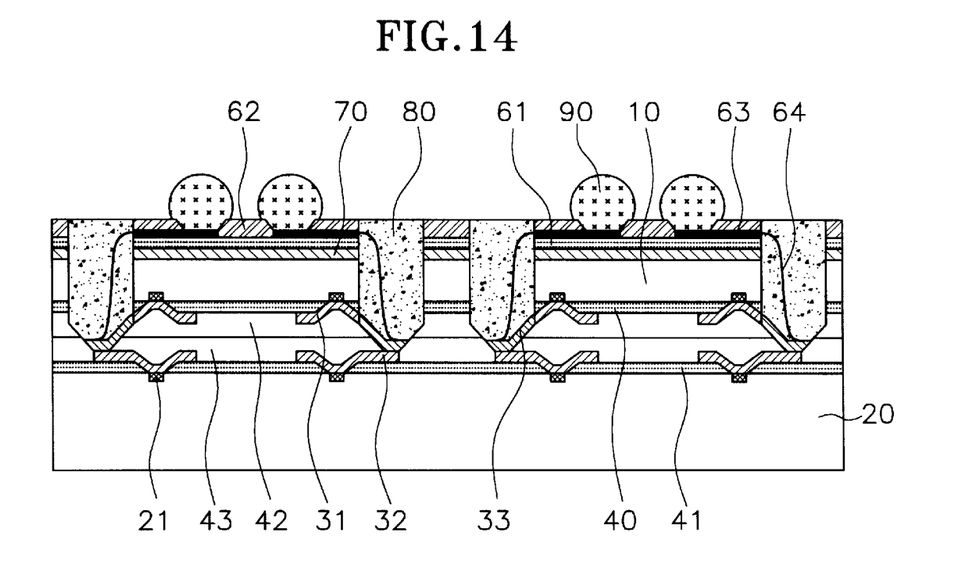

Afterward, as shown in FIG. 14, inside of the through hole 50 is filled with a molding compound 80 and a top surface of the molding compound 80 should be in the same plane with that of the pattern film 60, i.e. the surface of the upper insulating film 62. Next, a solder ball 90 is mounted at a ball land 65 formed at the pattern film 60.

Figure 15:
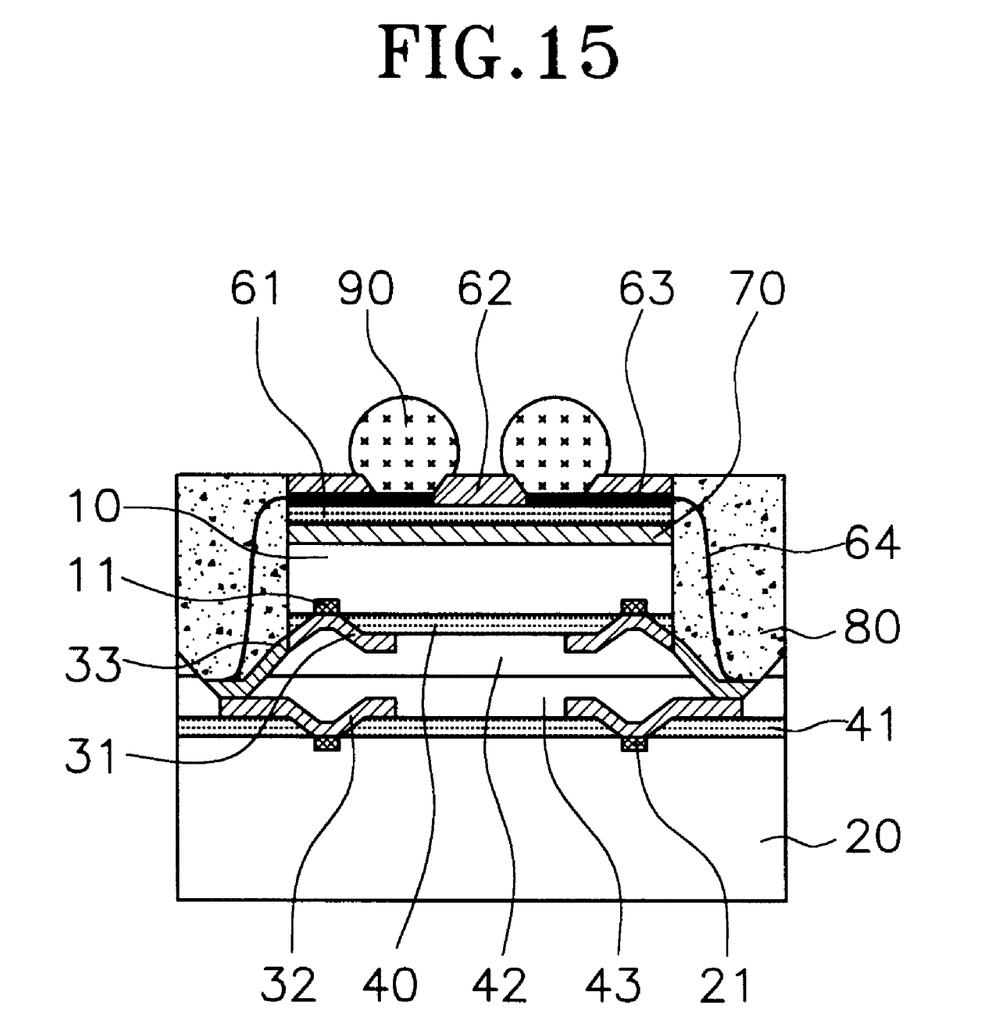

Finally, as mentioned above, the upper and the lower wafers 10,20 are cut off with respect to the outer wall of the through hole 50 and a wafer level stack package is completed according to the present invention as shown in FIG. 15. Meanwhile, materials for the metal patterns 31,32 and the medium pattern 33 can be selected from Au, Ag, Ni, In and Sn.

Structural aspect of the wafer level stack package shown in FIG. 15 is as follows. Since the upper and the lower wafers 10 and 20 are under the cut state, the upper and the lower semiconductor chips are arranged such that their bond pads 11,21 are opposed in up and down with a selected distance. Particularly, a selected thickness of the second face of the upper semiconductor chip is removed by polishing, the thickness of the upper semiconductor chip is thinner than that of the lower semiconductor chip.

At the respective first faces of the semiconductor chips, lower insulating layers 40,41 are coated to expose the bond pads 11,21. The upper and the lower metal patterns whose one ends are connected to the bond pads 11,21 are deposited. The lower metal pattern 32 is formed longer than the upper metal pattern 31. Second insulating layers 42,43 are coated on the respective first insulating layers 40,41, and the other ends of the lower metal. Pattern 32 are exposed through the second insulating layer 43 coated on the lower semiconductor chip.

A through hole 50 is formed at the contour of the upper semiconductor chip in which the other end of the lower metal pattern 32 is disposed, thereby exposing the other end of the lower metal pattern 32 through a bottom of the through hole 50 and also exposing the other end of the upper metal pattern 31 through an inner face of the through hole 50. The other ends of the exposed upper and the lower metal patterns 31,32 are electrically connected by means of a medium pattern 33 deposited on the bottom of the through hole 50.

A pattern film 60 is attached to the second face of the upper semiconductor chip and its metal wire 64 is electrically connected. The through hole 50 is filled with an epoxy compound 80, therefore the surface of the molding compound 80 is in the same plane with that of the pattern film 60 and the lateral face thereof is in the same plane with that of the lower semiconductor chip. A solder ball 90 is mounted at the ball land 65 of the pattern film 60.

According to the constitution of the present invention, stacking and packaging two semiconductor chips in the wafer level can be implemented. Further, a pattern film is attached to a backside of a selected stacked semiconductor chip, and a solder ball is mounted at the pattern film thereby shortening the signal transmission path. As a result, the electrical conductivity performance is improved. Particularly, the width of package can be implemented within the width of the semiconductor chip.

Although only the preferred embodiment of the present invention has been discussed, various other modifications, alternative constructions and equivalents may be used without departing from the spirit of the present invention and the scope thereof as defined by the following claims.

What is claimed is:

1. A wafer level stack package comprising:

upper and lower semiconductor chips each having a first face and an opposite second face, wherein the first face has a plurality of bond pads formed thereon, and wherein the first faces of the upper and lower semiconductor chips confront each other with a selected distance;

first insulating layers formed respectively on the first faces of the upper and lower semiconductor chips so that their bond pads are exposed therefrom;

upper and lower metal patterns formed respectively on the first insulating layers, wherein each metal pattern has a first end electrically connected to the bond pad and a second end laterally extended toward a boundary of the semiconductor chip;

second insulating layers formed respectively on the first insulating layers and attached to each other;

through holes formed at the boundary of the upper semiconductor chip so that the second ends of the upper and the lower metal patterns are exposed in the through holes;

medium patterns each formed on an inside wall of each through hole, wherein the second ends of the upper and the lower metal patterns in each through hole are electrically connected by each medium pattern;

a pattern film adhered on a second face of the upper semiconductor chip, and having a plurality of ball lands formed thereon, wherein each medium patterns are electrically connected to each ball land;

a molding compound filled inside the through holes; and solder balls each formed on each ball land of the pattern film.

2. The wafer level stack package of claim 1, wherein the pattern film comprises:

an insulating film having a plurality of slots each exposing the corresponding through holes;

a plurality of metal lines arranged in the insulating film, each metal line having a first end exposed from the insulating film thereby forming the ball land and a second end exposed to the corresponding slot; and a plurality of metal wires each electrically connecting the second end of the metal line and the corresponding medium pattern in the through hole.

3. The wafer level stack package of claim 1, wherein the molding compound has a top surface lying in the same plane as a top surface of the pattern film.

4. The wafer level stack package of claim 1, wherein the end of each lower metal pattern is exposed to a bottom side of the through holes, and the second end of each upper metal pattern is exposed to a lateral side of the through holes.

5. The wafer level stack package of claim 4, wherein the second insulating layer of the lower semiconductor chip has a plurality of slots each exposing the second end of the corresponding lower metal pattern.

6. A method of fabricating a wafer level stack packages, comprising the steps of:

providing upper and lower wafers, each wafer having first and opposite second faces and a plurality of semiconductor chips formed therein, each semiconductor chip having a plurality of bond pads formed on the first face of the corresponding wafer;

forming a first insulating layer on the first face of each wafer so that the bond pads are exposed therefrom;

forming metal patterns on the first insulating layer of each wafer by depositing a metal layer and then patterning the metal layer, wherein each metal pattern has a first end electrically connected to the corresponding bond pad and a second end laterally extended toward a boundary of the corresponding semiconductor chip;

forming a second insulating layer over the first insulating layer and the metal pattern of each wafer;

attaching the second insulating layers of the respective wafers so that the first faces of the wafers confront each other;

forming through holes at the boundaries of the semiconductor chips of the upper wafer so that the second ends of the metal patterns are exposed in the through holes;

forming medium patterns on inside walls of the through holes, wherein the second ends of the upper and the lower metal patterns in each through hole are electrically connected by each medium pattern;

adhering a pattern film to the second face of the upper wafer, wherein the pattern film includes an insulating film having a plurality of slots each exposing the corresponding through hole, a plurality of metal lines arranged in the insulating film, each metal line having a first end exposed from the insulating film thereby forming a ball land and a second end exposed to the corresponding slot, and plurality of metal wires each extended from the second end of the metal line;

electrically connecting the metal wires to the medium patterns in the corresponding through holes;

filling inside of the through holes with a molding compound;

forming solder balls on the ball lands of the pattern film; and separating the wafers into the individual wafer level stack packages along the through holes in the upper wafer.

7. The method of claim 6, further comprising the step of:

etching the second insulating layer on the lower wafer before the step of attaching the second insulating layers of the respective wafers.

8. The method of claim 6, further comprising the step of:

polishing the upper wafer from the second face thereof to remove a selected thickness after the step of attaching the second insulating layers of the respective wafers.

9. A wafer level stack package comprising:

a first semiconductor chip comprising a first face and a second face,
a first bond pad formed on the first face and
a first insulating pattern formed on the first face, the first insulating pattern having a first opening, the first opening exposing the first bond pad,
a first metal pattern formed on the first insulating pattern, the first metal pattern being in electrical contact with the first bond pad and having a first outer end extending toward an outer peripheral portion of the first semiconductor chip, and
a second insulating pattern formed on the first metal pattern, the second insulating pattern having a second opening, the second opening exposing a portion of the first outer end of the first metal pattern;

a second semiconductor chip comprising a third face and a fourth face,
a second bond pad formed on the third face and
a third insulating pattern formed on the third face, the third insulating pattern having a third opening, the third opening exposing the second bond pad,
a second metal pattern formed on the third insulating pattern, the second metal pattern being in electrical contact with the second bond pad and having a second outer end extending toward an outer peripheral portion of the second semiconductor chip, and
a fourth insulating pattern formed on the second metal pattern;

wherein the fourth insulating pattern of second semiconductor chip is mounted to the second insulating pattern of the first semiconductor chip so that first outer end and the second outer end are generally aligned in a stacked arrangement;

a first through hole having a sidewall formed in an outer peripheral portion of, and generally perpendicular to, the fourth face of the second semiconductor chip and extending completely through the second semiconductor chip and incorporating the second opening on the first face of the first semiconductor chip, a portion of the second outer end being exposed at a portion of the sidewall and a portion of the first outer end being exposed at the bottom of the first through hole;

a third metal pattern formed in a lower portion of the through hole, the third metal pattern providing an electrical connection between the first outer end of the first metal pattern and the second outer end of the second metal pattern;

a pattern film mounted on the fourth face of the second semiconductor chip, the pattern film comprising a fifth insulating layer, a fourth metal pattern, and a sixth insulating layer, the sixth insulating layer having a first opening that exposes a portion of the fourth metal pattern to form a ball land, the exposed portion of the fourth metal pattern being located at an interior portion of the pattern film, and a second through hole, the second through hole being generally aligned with the first through hole to expose the third metal pattern and having a sidewall, a portion of the fourth metal pattern being exposed at the sidewall;

a conductor formed between the third metal pattern and the fourth metal pattern to provide electrical contact, the conductor being positioned in the through hole;

a molding composition filling the through hole and surrounding the conductor; and a solder ball formed on the ball land of the pattern film.

* * * * *